(12) United States Patent
Hirano et al.

(10) Patent No.: US 6,576,381 B1
(45) Date of Patent: Jun. 10, 2003

(54) SEMICONDUCTOR DEVICE

(75) Inventors: Takashi Hirano, Tokyo (JP); Kagehisa Yamamoto, Tokyo (JP); Toshio Banba, Tokyo (JP); Hiroaki Makabe, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 09/913,156

(22) PCT Filed: Feb. 23, 2000

(86) PCT No.: PCT/JP00/01028
§ 371 (c)(1),
(2), (4) Date: Aug. 10, 2001

(87) PCT Pub. No.: WO00/52757
PCT Pub. Date: Sep. 8, 2000

(30) Foreign Application Priority Data

Feb. 26, 1999 (JP) ............................................. 11-051422
Feb. 17, 2000 (JP) ........................................ 2000-039079

(51) Int. Cl.$^7$ .............................. G03C 3/00; G03F 7/023
(52) U.S. Cl. .............................. 430/11; 430/12; 430/14; 430/18; 430/165; 430/191; 430/192; 430/193; 430/330; 257/753
(58) Field of Search ............................... 430/11, 12, 18, 430/14, 330, 191, 192, 193, 165; 257/753

(56) References Cited

U.S. PATENT DOCUMENTS 5,162,257 A * 11/1992 Yung ........................... 438/613
5,194,934 A * 3/1993 Yamazaki et al. ........... 257/782
5,376,499 A   12/1994 Hammerschmidt et al. . 430/192
5,641,996 A * 6/1997 Omoya et al. ............... 257/787
6,071,666 A * 6/2000 Hirano et al. ............... 430/191
6,222,272 B1 * 4/2001 Takayama et al. ........... 257/773

FOREIGN PATENT DOCUMENTS

| EP | 807852 | 11/1997 |
| JP | 11-35915 | 9/1999 |
| JP | 11-312675 | 9/1999 |
| WO | 96/30933 | 10/1996 |

OTHER PUBLICATIONS

Supplementary European Search Report issued for corresponding European Appln. No. EP 00 90 5287.9 dated Apr. 4, 2002.

* cited by examiner

Primary Examiner—John S. Chu
(74) Attorney, Agent, or Firm—Smith, Gambrell & Russell, LLP

(57) ABSTRACT

The present invention alleviates the operational problems in production of flip chips and provides a semiconductor device superior in various reliabilities. The preset invention lies in an encapsulated semiconductor device comprising:

(a) a polybenzoxazole resin film for chip protection, obtained by coating, on a circuit-formed chip, a positive photosensitive resin composition comprising 100 parts by weight of a polyamide and 1 to 100 parts by weight of a photosensitive diazoquinone compound, and subjecting the coated composition to patterning and curing, and (b) a bump electrode.

8 Claims, 4 Drawing Sheets

SEMICONDUCTOR DEVICE

TECHNICAL FIELD

The present invention relates to a semiconductor device having a positive photosensitive resin composition of high sensitivity, capable of giving a pattern of high residual film ratio and provided with a bump electrode.

BACKGROUND ART

In conventional semiconductor chips, an inorganic film (e.g. $SiO_2$ film or SiN film) is formed for circuit protection. Further, a polyimide resin is coated for relaxation of the physical damage given in the encapsulation step (e.g. transfer molding). Also, in recent years, in connection with the increase in the input terminals of a semiconductor chip, there has come to be employed flip chip mounting which comprises forming a bump on a bare chip and mounting the resulting chip on a substrate with the face directed down.

When, in the above semiconductor chip structure, bare chip mounting typified by flip chip mounting is employed, however, there has been a problem that the high water absorption of the polyimide resin incurs deterioration of dielectric strength and reduction in reliability, with the lapse of time.

There has also been a problem that the formation of polyimide pattern requires a long operational time and moreover is inferior in precision of processing.

The present invention aims at alleviating the above-mentioned operational problem in production of a flip chip and providing a semiconductor device superior in various reliabilities.

DISCLOSURE OF THE INVENTION

The present invention lies in a semiconductor device comprising:

(a) a polybenzoxazole resin film for chip protection, obtained by coating, on a circuit-formed chip, a positive photosensitive resin composition comprising 100 parts by weight of a polyamide represented by the following general formula (1) and 1 to 100 parts by weight of a photosensitive diazoquinone compound, and subjecting the coated composition to patterning and curing, and (b) a bump electrode:

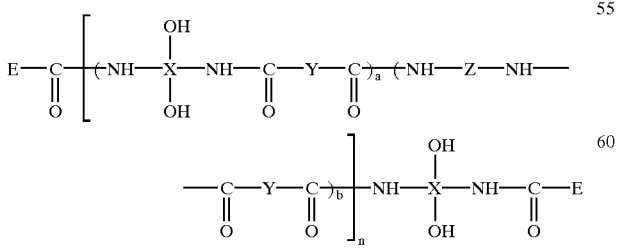

(1)

wherein X is a tetravalent aromatic group; Y is a bivalent aromatic group; Z is

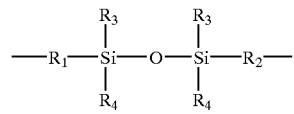

($R_1$ and $R_2$ are each a bivalent organic group, and $R_3$ and $R_4$ are each a monovalent organic group); E is a carboxyl aliphatic, alicyclic or aromatic group having at least one alkenyl or alkinyl group; and a and b are each a molar fraction, a+b=100 mole %, a=60.0 to 100.0 mole % and b=0 to 40.0 mole %; and n=2 to 500.

Preferably, the positive photosensitive resin composition contains a bisphenol compound represented by the following general formula (2) and a trisphenol compound represented by the following general formula (3) in a total amount of 1 to 30 parts by weight:

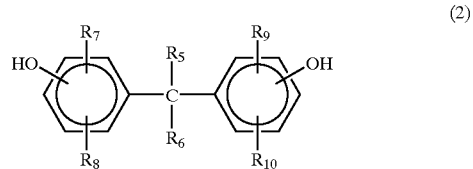

(2)

wherein $R_5$ and $R_6$ are each a hydrogen atom or an alkyl group; $R_7$, $R_8$, $R_9$ and $R_{10}$ are each one atom or group selected from hydrogen atom, a halogen atom, hydroxyl group, an alkoxy group, a cycloalkyl group and an alkyl group, and

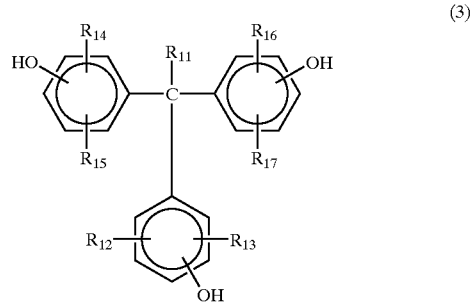

(3)

wherein $R_{11}$ is hydrogen atom or an alkyl group; and $R_{12}$, $R_{13}$, $R_{14}$, $R_{15}$, $R_{16}$ and $R_{17}$ are each one atom or group selected from hydrogen atom, a halogen atom, hydroxyl group, an alkyl group, an alkoxy group and a cycloalkyl group.

Preferably, the proportions of the bisphenol compound and the trisphenol compound are 10:90 to 90:10. The X of the polyamide is selected from the followings:

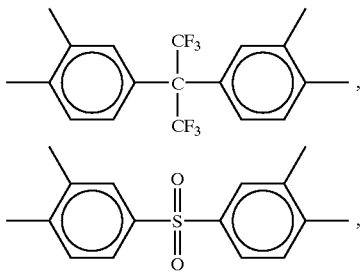

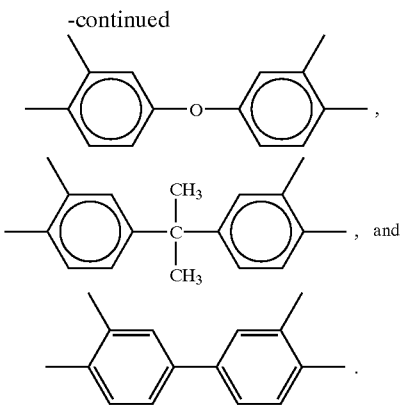

The Y of the polyamide is selected from the followings:

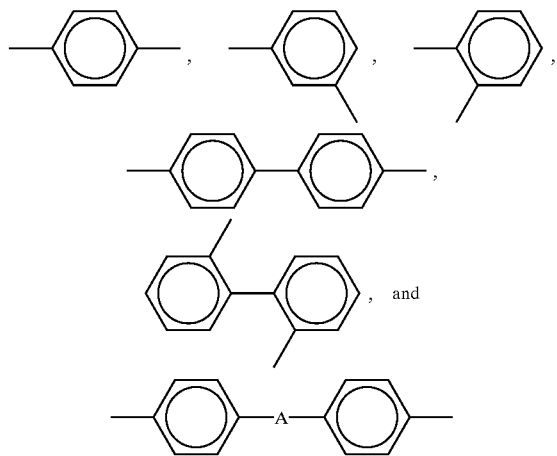

wherein A is —CH$_2$—, —C(CH$_3$)$_2$—, —O—, —S—, —SO$_2$—, —CO—, —NHCO— or —C(CF$_3$)$_2$—. The positive photosensitive resin composition is cured at a temperature of 280 to 440° C.

Figure 1:
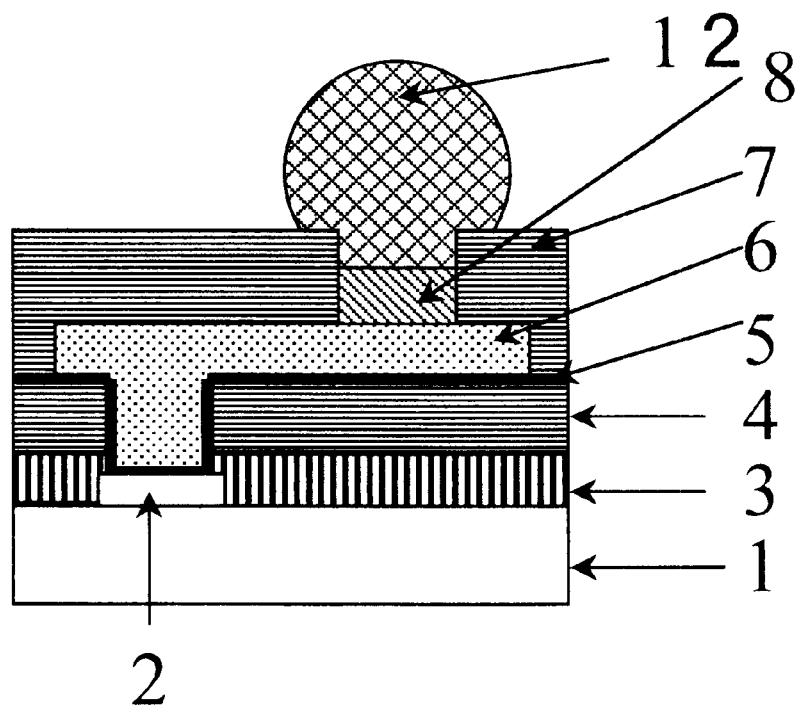
FIG. 1 is a sectional view of the pad portion of an example of the semiconductor device of the present invention.
Figure 2:
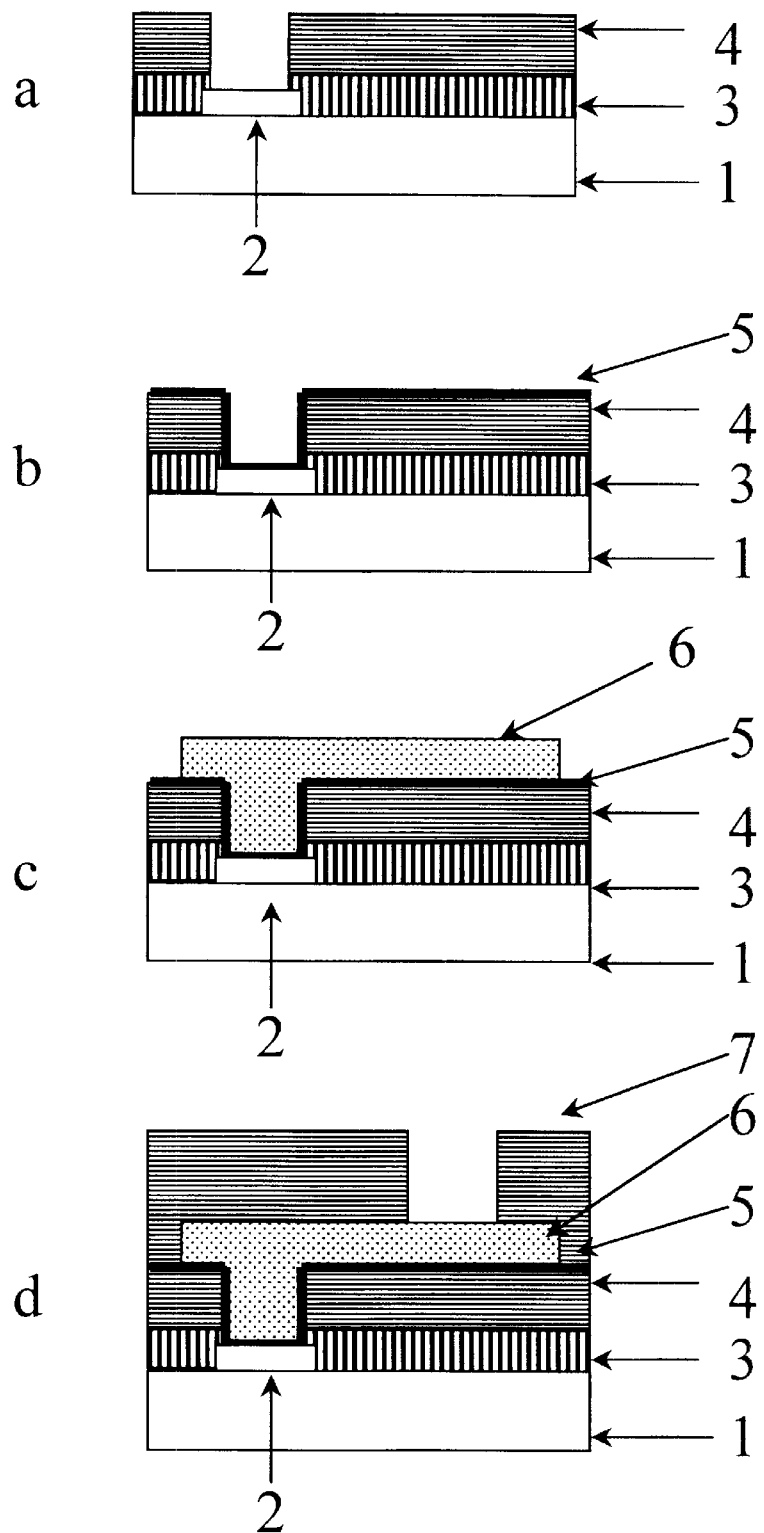
FIGS. 2a to 2d are sectional views showing production steps of an example of the semiconductor device of the present invention.
Figure 3:
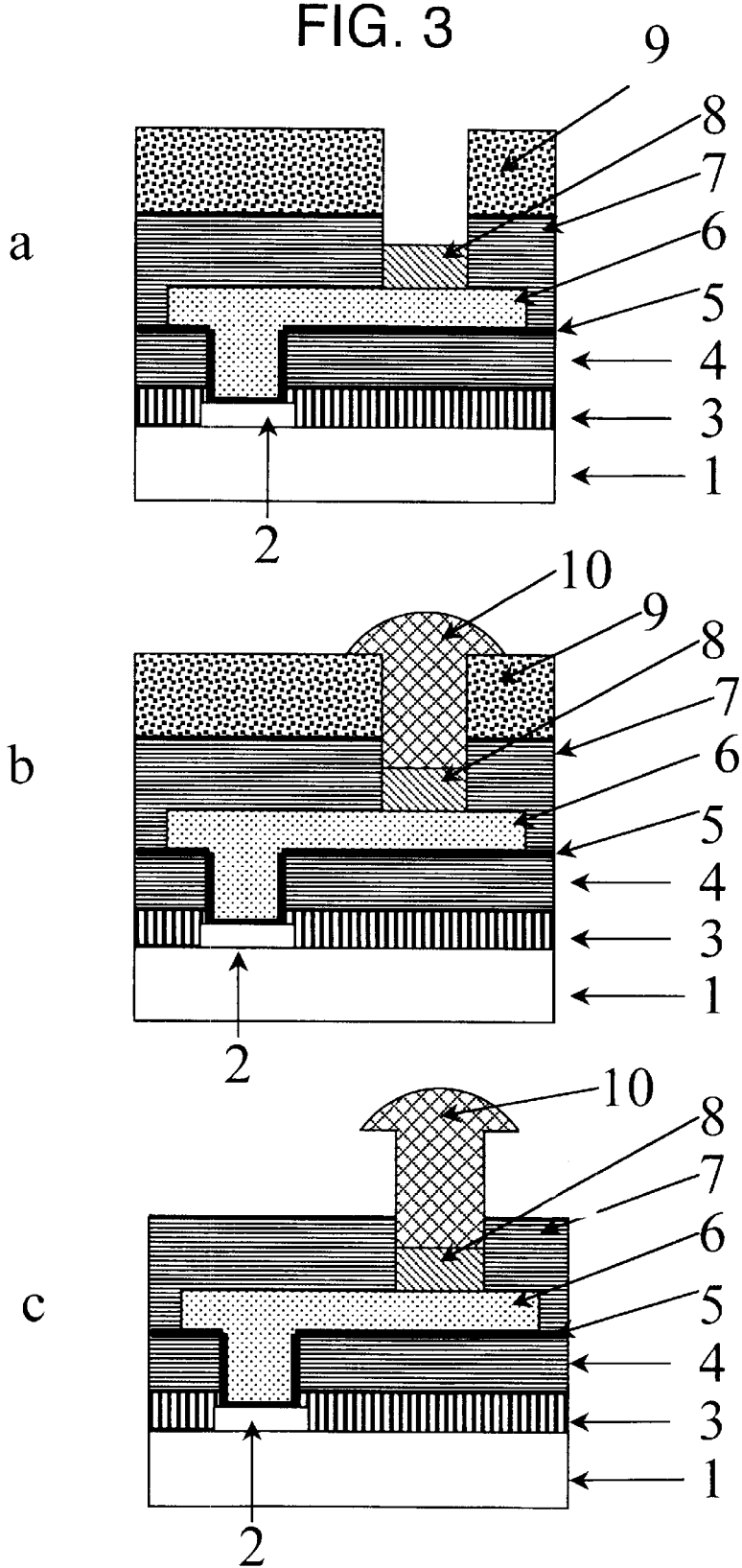
FIGS. 3a to 3c are sectional views showing production steps of an example of the semiconductor device of the present invention.
Figure 4:
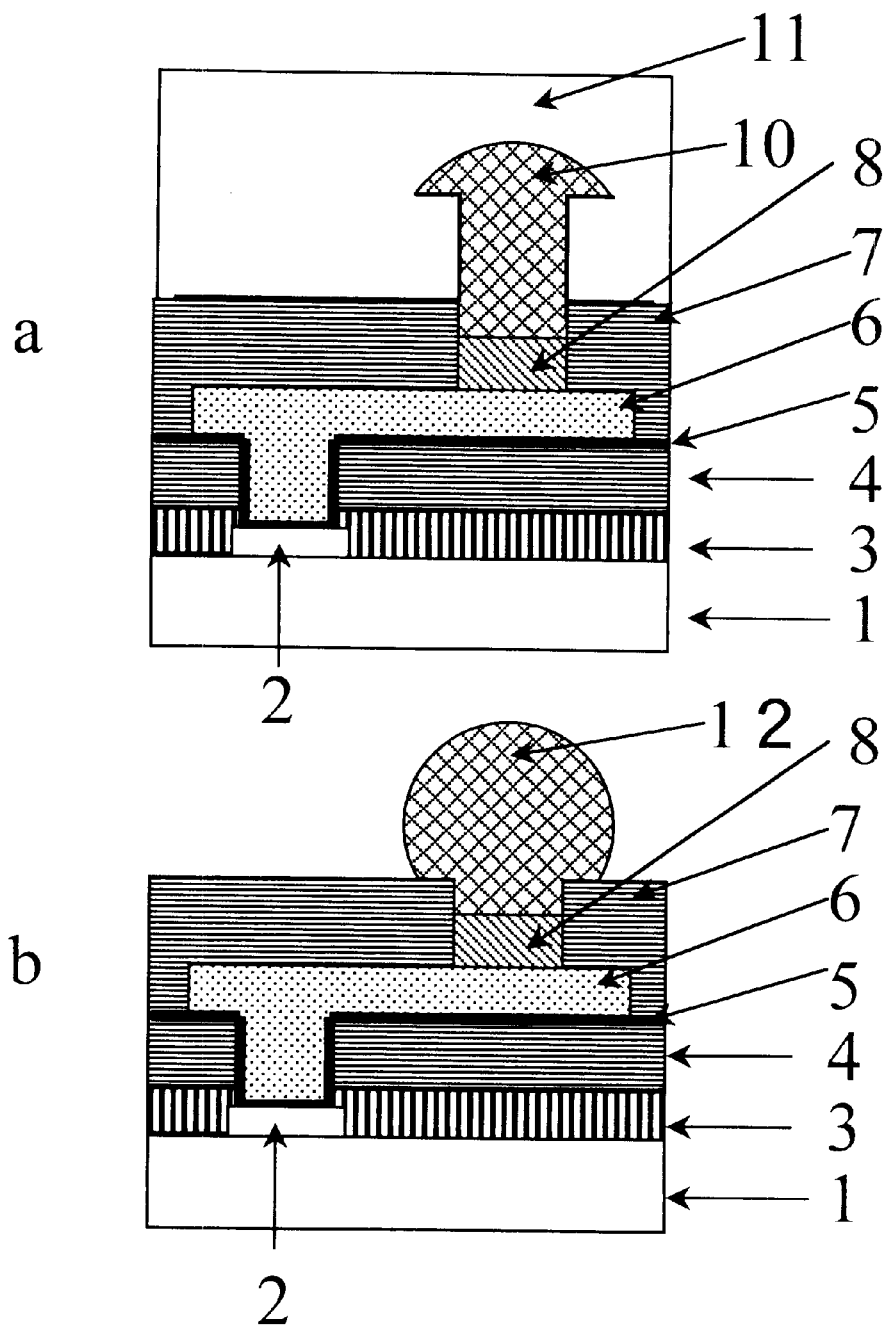
FIGS. 4a and 4b are sectional views showing production steps of an example of the semiconductor device of the present invention.

The numerals used in FIGS. 1 to 4 have the followings meanings.
1: Silicon wafer, 2: Al pad, 3: passivation film,
4: buffer coat film; 5: metal (e.g. Cr or Ti) film,
6: wiring (e.g. Al or Cu), 7: insulating film,
8: barrier metal, 9: resist, 10: solder
11: flux, 12: solder bump

DETAILED DESCRIPTION OF THE INVENTION

The polyamide of the formula (1) is composed of a bisaminophenol having a structure of X, a dicarboxylic acid having a structure of Y and an acid anhydride having a structure of E. This polyamide, when heated at about 280 to 440° C., gives rise to dehydration and ring closure and is converted into a heat-resistant resin called polybenzoxazole.

The X of the polyamide (1) of the present invention is, for example, one of the followings:

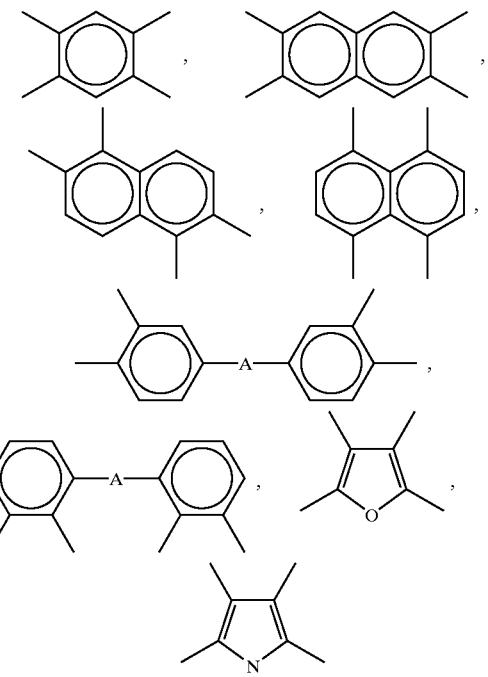

wherein A is —CH$_2$—, —C(CH$_3$)$_2$—, —O—, —S—, —SO$_2$—, —CO—, —NHCO— or —C(CF$_3$)$_2$—. However, the X is not restricted thereto.

Of the above examples, particularly preferred one is selected from the followings:

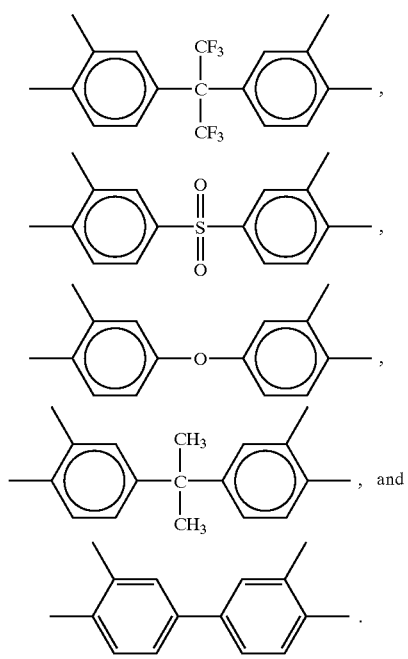

The Y of the formula (1) is, for example, one of the followings:

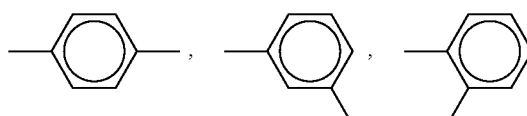

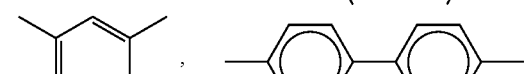

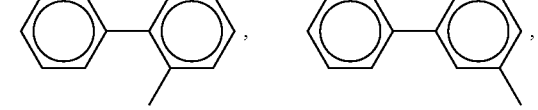

, and

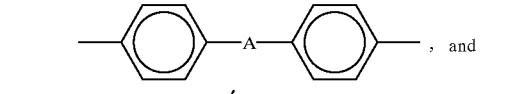

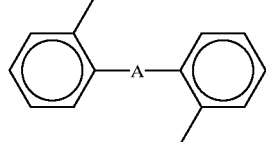

wherein A is —CH$_2$—, —C(CH$_3$)$_2$—, —O—, —S—, —SO$_2$—, —CO—, —NHCO— or —C(CF$_3$)$_2$—. However, the Y is not restricted thereto.

Of the above examples, particularly preferred one is selected from the followings:

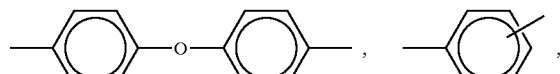

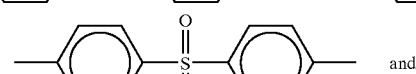 and

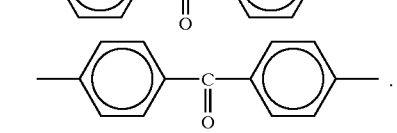

The E of the formula (1) includes, for example, the followings:

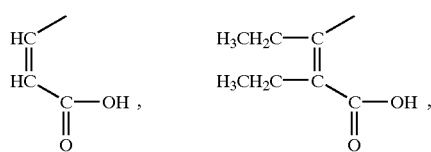

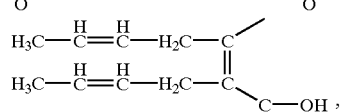

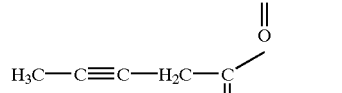

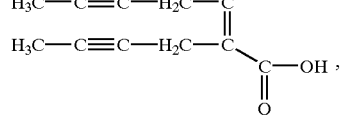

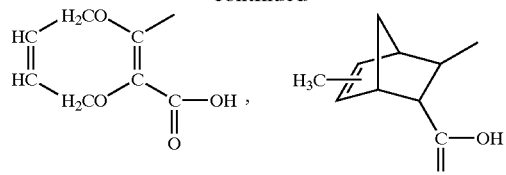

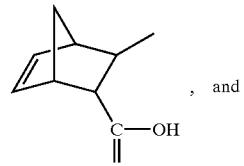

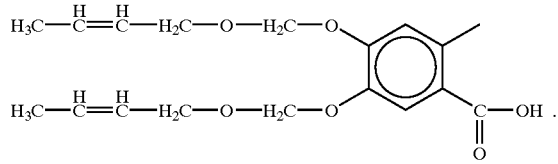

However, the E is not restricted thereto.

Of the above examples, particularly preferred one is selected from the followings:

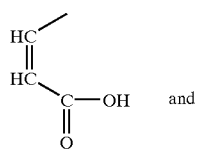 and 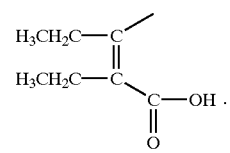

In the present invention, a dicarboxylic acid derivative having a Y structure is reacted with a bisaminophenol having an X structure, to synthesize a polyamide, after which the terminal amino groups of the polyamide are capped with an acid anhydride having at least one alkenyl or alkinyl group, represented by the E of the formula (1).

Further, the Z of the formula (1) is, for example, one of the followings:

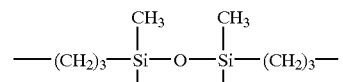

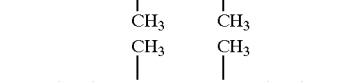

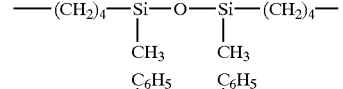

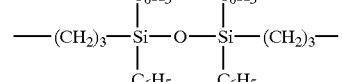

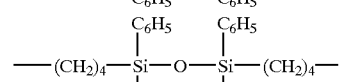

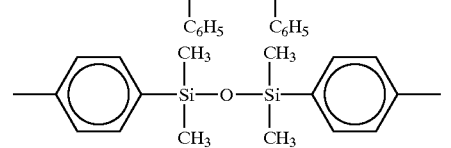

-continued

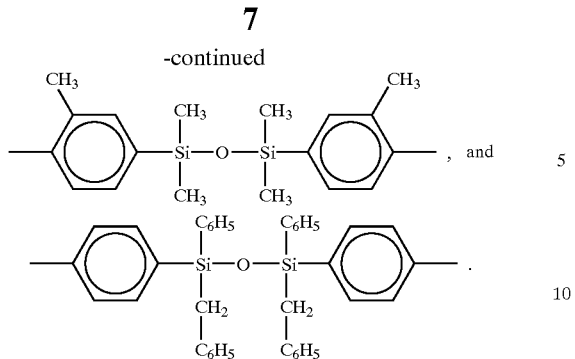

However, the Z is not restricted thereto.

The Z of the formula (1) is used, for example, when very high adhesivity to a substrate (e.g. silicon wafer) is required. The proportion b of the Z used is 40 mole % or less. When the proportion is more than 40 mole %, the resulting resin has very low solubility, resulting in scum generation and no pattern formation. Incidentally, each of the X, Y, E and Z used may be given by a single substance or a mixture of two or more kinds of substances.

The photosensitive diazoquinone compound used in the present invention is a reaction product between a compound having a 1,2-benzoquinone diazide or 1,2-naphthoquinone diazide structure and a phenol type compound which is a substrate.

In the positive photosensitive resin composition of the present invention, it is important to allow the composition to contain a photosensitive diazoquinone compound so that, in particular, a high sensitivity and a high residual film ratio can be obtained during the development of the composition. The development of a positive photosensitive resin is conducted by utilizing the difference in solubility between the exposed and non-exposed portions of the resin. In order to obtain a high sensitivity and a high residual film ratio, it is necessary that the exposed portion is highly soluble and the non-exposed portion is highly insoluble so that the difference in solubility between the exposed and non-exposed portions becomes as large as possible. The difference in solubility between the exposed and non-exposed portions is largely dependent upon the structure of the phenol type compound which is a substrate. Hence, a search was made for photosensitive diazoquinone compounds having a substrate capable of promoting dissolution of exposed portion, suppressing dissolution of non-exposed portion, and thereby giving a sufficient residual film ratio. As a result, it was found out that the following compounds have a high sensitivity and yet give a high residual film ratio.

The photosensitive diazoquinone compound includes the following compounds but is not restricted thereto:

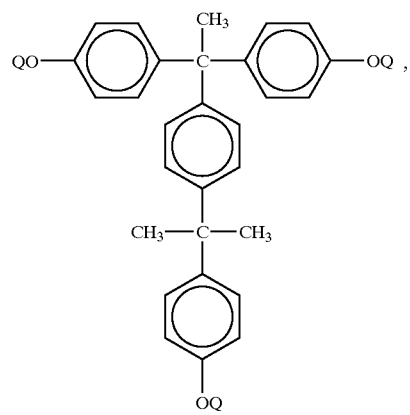

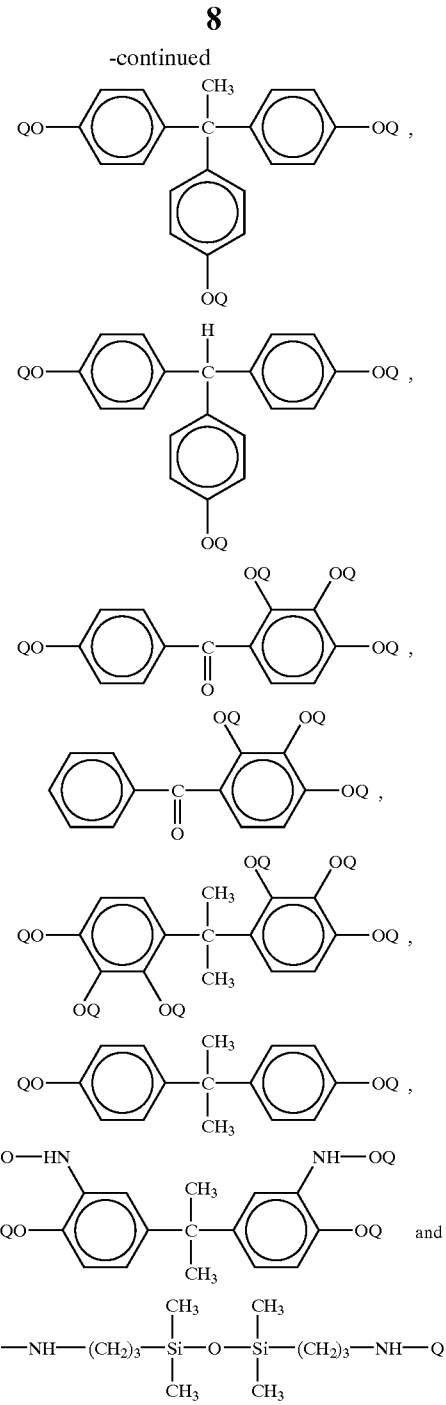

wherein each Q is selected from hydrogen atom,

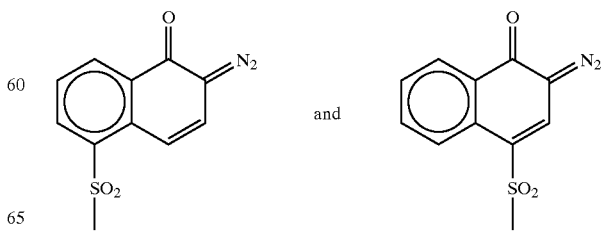

and, in each compound, at least one Q is

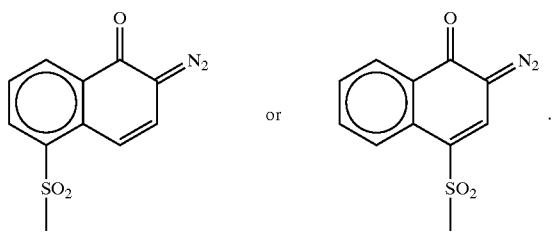

The proportion of the photosensitive diazoquinone compound relative to the polyamide is 1 to 100 parts by weight relative to 100 parts by weight of the polyamide. When the proportion is less than 1 part by weight, the resulting resin is inferior in pattern-formability. When the proportion is more than 100 parts by weight, there occur a large decrease in sensitivity and a significant reduction in tensile elongation of the resulting film.

The positive photosensitive resin composition of the present invention may contain, as necessary, a dihydropyridine derivative for higher photosensitivity. As the dihydropyridine derivative, there can be mentioned, for example, 2,6-dimethyl-3,5-diacetyl-4-(2'-nitrophenyl)-1,4-dihydropyridine, 4-(2'-nitrophenyl)-2,6-dimethyl-3,5-dicarboethoxy-1,4-dihydropyridine and 4-(2',4'-dinitrophenyl)-2,6-dimethyl-3,5-dicarbomethoxy-1,4-dihydropyridine.

Preferably, the positive photosensitive resin composition of the present invention further contains a combination of a bisphenol compound represented by the general formula (2) and a trisphenol compound represented by the general formula (3). By adding these phenol compounds represented by the general formulas (2) and (3) to a positive photosensitive resin composition constituted by a polybenzoxazole precursor and a diazoquinone compound, there can be obtained a positive photosensitive resin composition which has increased adhesivity to an encapsulating resin, shows a high sensitivity and gives a high residual film ratio, in development, and causes no deposition of phenol even when stored at a low temperature of −60 to −50° C. and has excellent storability.

Adhesivity to an encapsulating resin can be obtained to a certain extent even when only either of the phenol compounds represented by the general formulas (2) and (3) is added. However, when only the bisphenol compound represented by the general formula (2) is added, an increase in addition amount tends to cause deposition of phenol upon storage of the resin composition at a low temperature of −60 to −50° C. When only the trisphenol compound represented by the general formula (3) is added, an increase in addition amount causes a significant reduction in residual film ratio. In contrast, when the bisphenol compound represented by the general formula (2) and the trisphenol compound represented by the general formula (3) are used in combination, the problems possessed by the individual compounds are alleviated, and an even higher photosensitivity and excellent adhesivity to an encapsulating resin can be obtained.

The addition amount of the phenol compounds are 1 to 30 parts in the total amount of the bisphenol compound represented by the general formula (2) and the trisphenol compound represented by the general formula (3), relative to 100 parts by weight of the polyamide represented by the general formula (1). When the addition amount of the two phenol compounds is more than 30 parts by weight, a deposit is generated in the low-temperature (−60 to −50° C.) storage of the resin composition as mentioned before and a significant reduction in residual film ratio appears during development. When the addition amount is less than 1 part by weight, there occur not only a reduction in adhesivity to an encapsulating resin but also a decrease in sensitivity during development.

The proportions of the bisphenol compound and the trisphenol compound are 10:90 to 90:10. When the proportion of the bisphenol compound is less than 10, a reduction in residual film ratio appears. When the proportion is more than 90, deposition takes place.

As the bisphenol compound represented by the general formula (2), for example, the following compounds can be mentioned. However, the bisphenol compound (2) is not restricted thereto.

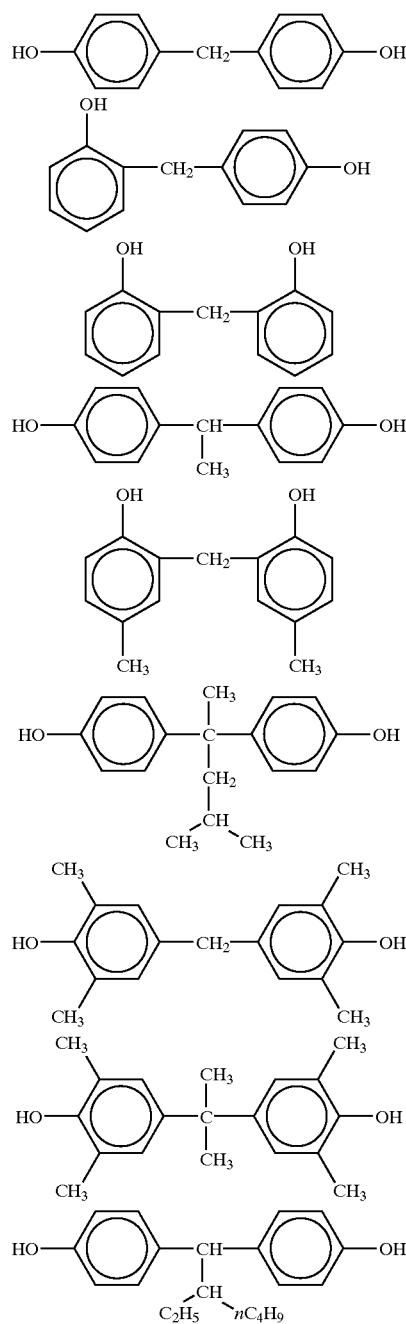

-continued
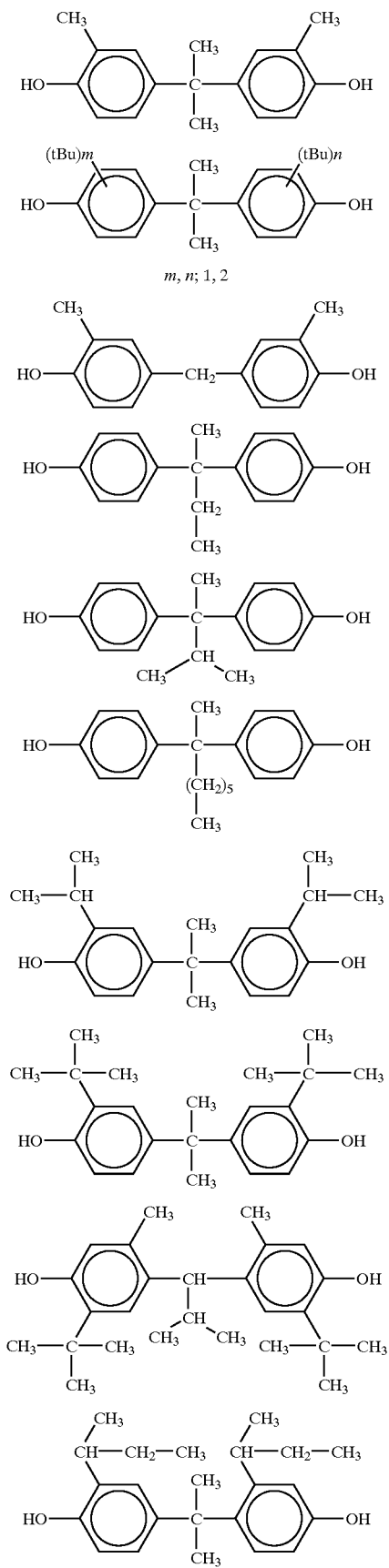
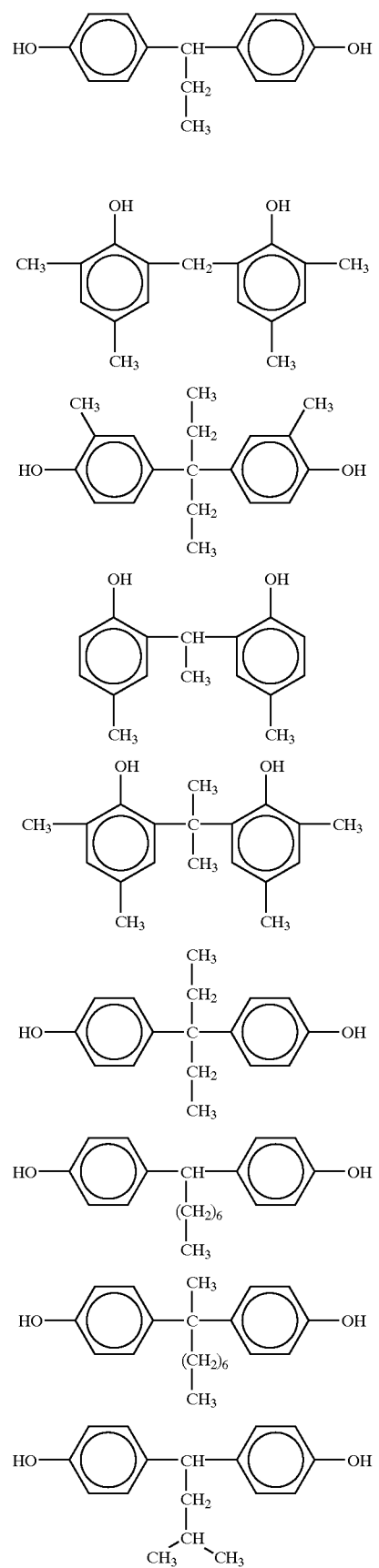

-continued
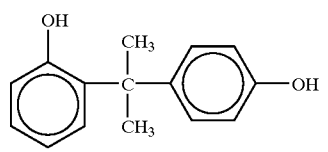
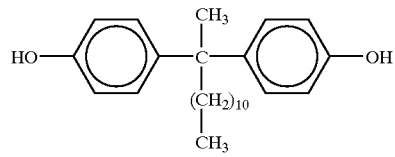
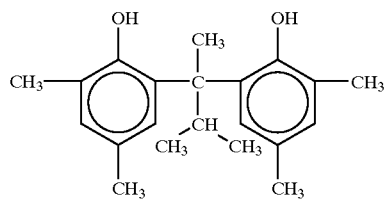
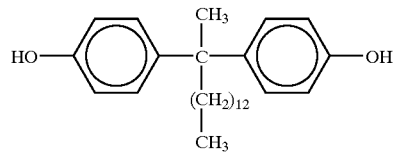
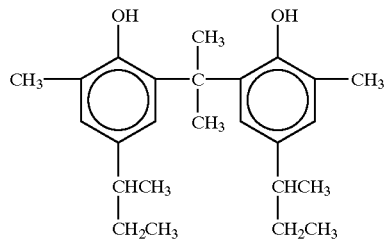
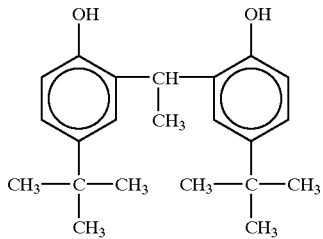
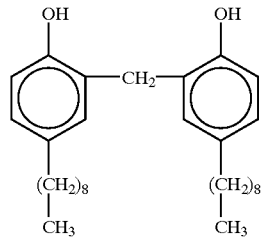
Of the above compounds, particularly preferred are:
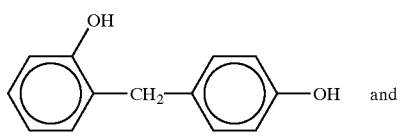 and
-continued
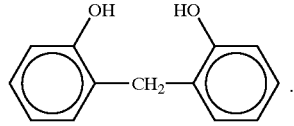
As the compound represented by the general formula (3), there can be mentioned for example the following compounds. However, the compound (3) is not restricted thereto.
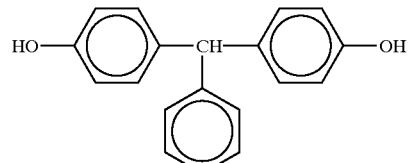
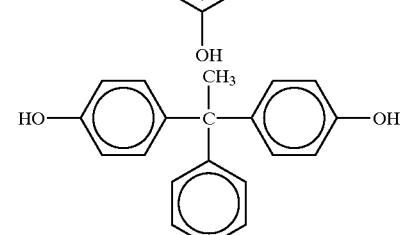
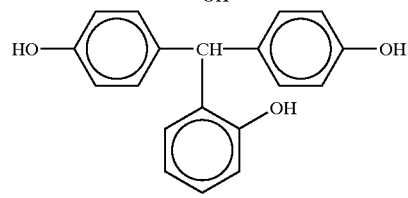
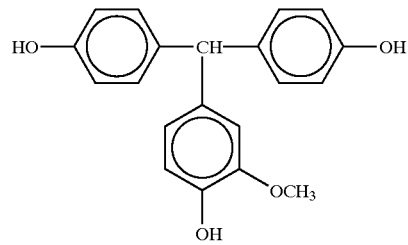
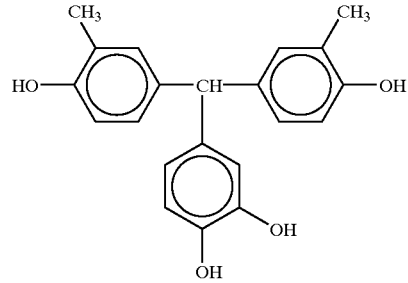
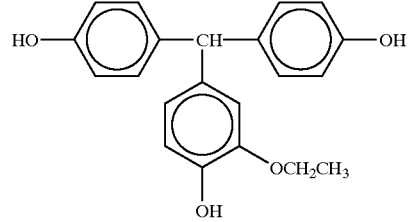

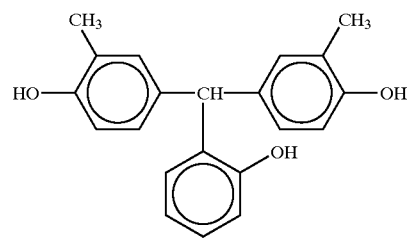
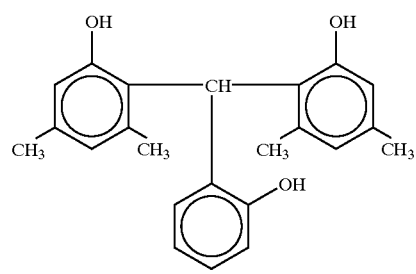
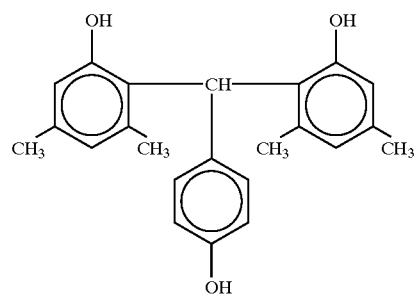
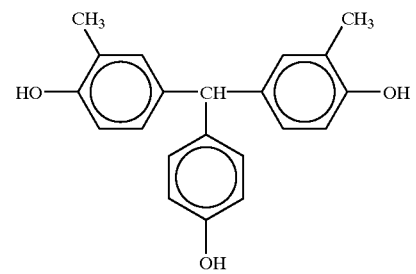
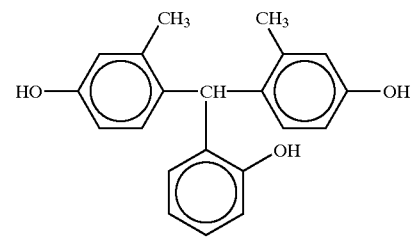
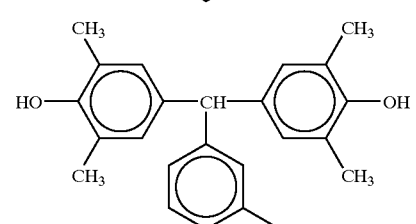
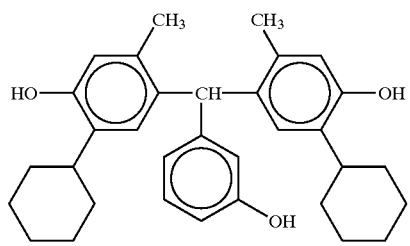
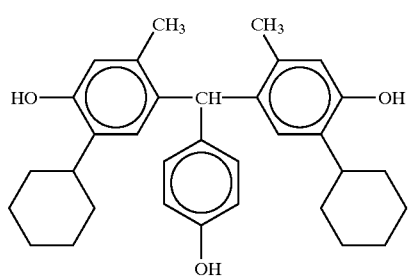
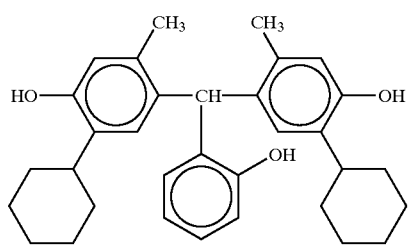
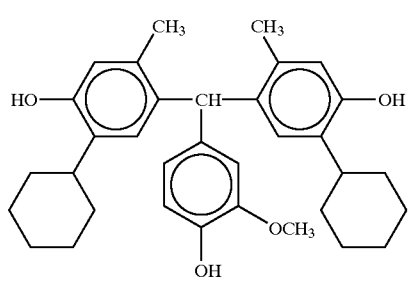
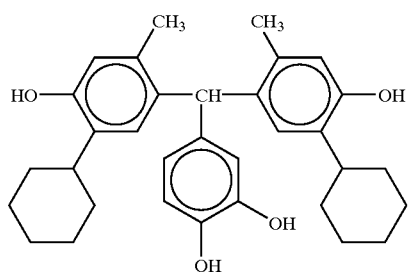
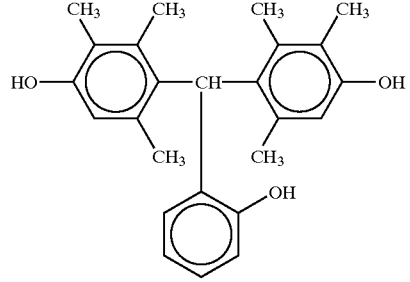

-continued

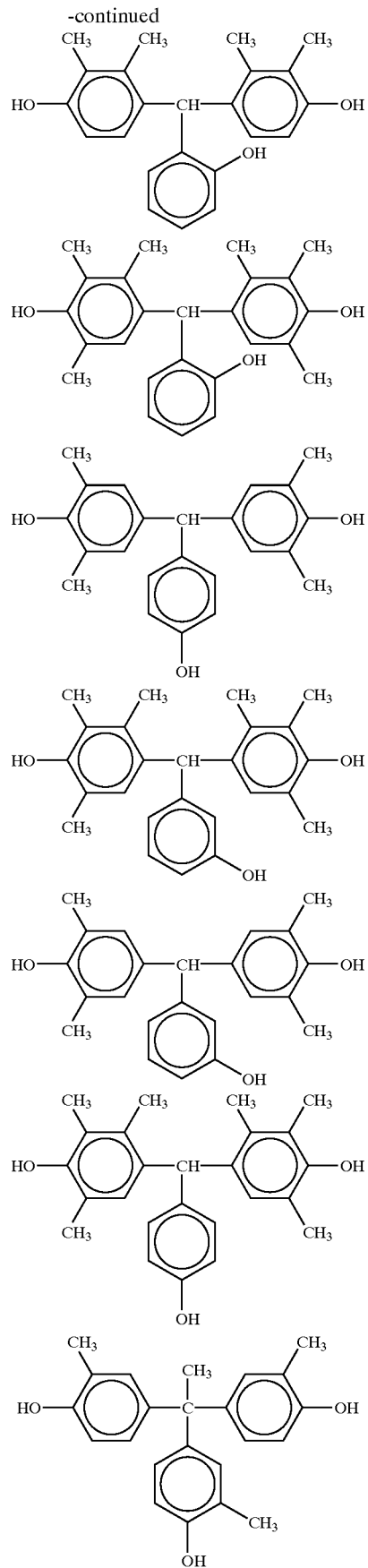

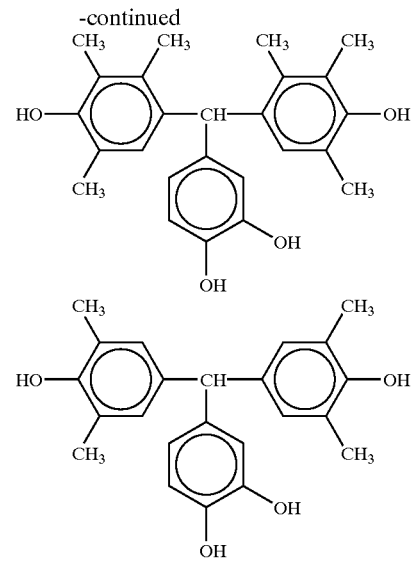

Of the above compounds, particularly preferred are:

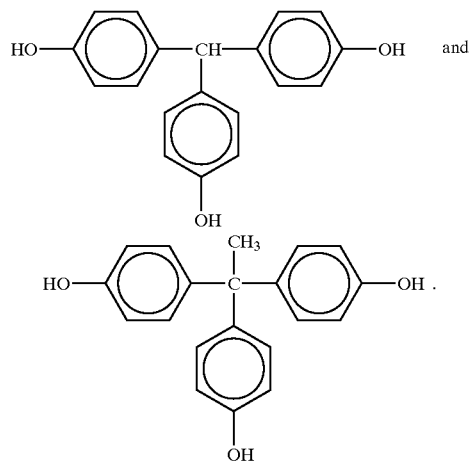

The positive photosensitive resin composition of the present invention can contain, as necessary, additives such as leveling agent, silane coupling agent and the like.

In the presents invention, these components are dissolved in a solvent and used in a varnish state. As the solvent, there can be mentioned N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxypropionate, etc. These solvents may be used singly or in admixture.

In using the positive photosensitive resin composition of the present invention, first, the composition is coated on an appropriate substrate, for example, a silicon wafer, a ceramic substrate or an aluminum substrate. The amount of the composition coated is, in production of a semiconductor device, such that the final film thickness after curing becomes 0.1 to 20 μm. When the film thickness is less than 0.1 μm, the film is unable to sufficiently exhibit the function as a protective surface film for a semiconductor chip. When the film thickness is more than 20 μm, it is difficult to obtain a fine pattern and, moreover, a long time is taken for processing, resulting in reduced throughput.

As the method for coating, there are spin coating using a spinner, spray coating using a spray coater, immersion, printing, roll coating, etc.

Then, prebaking is conducted at 60 to 130° C. to dry the coating film, after which an actinic ray is applied in a desired pattern. As the actinic ray, there can be used an X-ray, an electron beam, an ultraviolet light, a visible light, etc.; however, an actinic ray having a wavelength of 200 to 500 nm is preferred. Then, the actinic ray-applied portion is dissolved and removed with a developing solution to obtain a relief pattern.

As the developing solution, there can be preferably used an aqueous solution of an alkali, e.g., an inorganic alkali such as sodium hydroxide, potassium hydroxide, sodium carbonate, sodium silicate, sodium metasilicate, ammonia water or the like; a primary amine such as ethylamine, n-propylamine or the like; a secondary amine such as diethylamine, di-n-propylamine or the-like; a tertiary amine such as triethylamine, methyldiethylamine or the like; an alcohol amine such as dimethylethanolamine, triethanolamine or the like; or a quaternary ammonium salt such as tetramethylammonium hydroxide, tetraethylammonium hydroxide or the like, or an aqueous solution obtained by adding, to the above aqueous solution, an appropriate amount of a water-soluble organic solvent, e.g., an alcohol such as methanol, ethanol or the like or a surfactant. As the method for development, a means such as spraying, paddle, immersion, ultrasonic wave or the like is usable.

Then, the relief pattern formed by development is rinsed. As the rinsing liquid, distilled water is used. Then, a heat treatment is applied at 280 to 440° C. to form an oxazole ring to obtain a final pattern of high heat resistance. The heat treatment is conducted preferably at 350 to 440 C. because, in particular, the bump-forming step conducted later includes exposure to a chemical such as a flux and a high-temperature treatment. When the temperature of the heat treatment (curing) is less than 280° C., a long time is taken for the curing. When the temperature is more than 440° C., the properties of the resulting film are inferior.

BEST MODE FOR CARRYING OUT THE INVENTION

Next, description is made on the examples of using the photosensitive resin composition of the present invention for a semiconductor device having a bump, referring to the accompanying drawings. FIG. 1 is an enlarged sectional view of the pad portion of a semiconductor device having a bump, of the present invention. As shown in FIG. 1, an Al pad 2 for input and output is formed on a silicon wafer 1; thereon is formed a passivation film 3; and a via hole is formed in the passivation film 3. Thereon is formed a polybenzoxazole resin film (a buffer coat film) 4; further, a metal (e.g. Cr or Ti) film 5 is formed so as to contact with the Al pad 2; the metal film 5 is removed by etching, in the vicinity of a solder bump 12 to secure insulation between pads. A barrier metal 8 and a solder bump 12 are formed for the insulated pad.

The present invention is specifically described below by way of Examples.

EXAMPLE 1

Synthesis of Polyamide

Into a four-necked separable flask provided with a thermometer, a stirrer, a raw material inlet and a dry nitrogen gas-introducing tube were placed 366.3 g (1.0 mole) of hexafluoro-2,2-bis(3-amino-4-hydroxyphenyl)propane and 443.2 g (0.9 mole) of a dicarboxylic acid derivative obtained by a reaction between 1 mole of diphenyl ether-4,4'-dicarboxylic acid and 2 moles of 1-hydroxy-1,2,3-benzotriazole. 3,000 g of N-methyl-2-pyrrolidone was added to dissolve the above compounds. Then, a reaction was allowed to take place at 75° C. for 12 hours by using an oil bath.

Then, 32.8 g (0.2 mole) of 5-norbornene-2,3-dicarboxylic acid anhydride dissolved in 500 g of N-methyl-2-pyrrolidone was added and stirring was conducted for 12 hours to complete the reaction. The reaction mixture was filtered and then poured into a solution of water/methanol= 3/1. The resulting precipitate was collected by filtration, washed with water sufficiently, and dried under vacuum to obtain an intended polyamide (A-1).

Preparation of Positive Photosensitive Resin Composition 100 g of the above-synthesized polyamide (A-1) and 25 g of a diazoquinone (B-1) having the undermentioned structure were dissolved in 250 g of N-methyl-2-pyrrolidone. The resulting solution was filtered through a 0.2-μm teflon filter to obtain a photosensitive resin composition.

B-1:

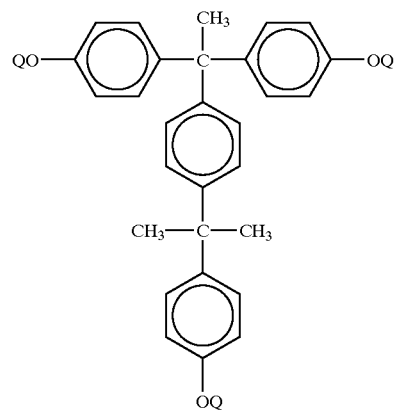

In the above formula, each Q is hydrogen atom or

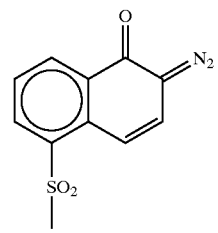

and 70% of the total Qs is

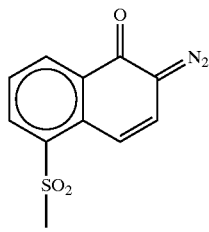

Evaluation of Properties

The above-obtained positive photosensitive resin composition was coated on a wafer using a spin coater, followed by drying on a hot plate at 120° C. for 4 minutes to obtain a coating film having a thickness of about 5 µm. To this coating film was applied a light at 400 mJ/cm² through a reticle using a g-line stepper, NSR-1505G3A (a product of Nikon Corporation).

Then, the resulting material was immersed in a 1.40% aqueous tetramethylammonium hydroxide solution to dissolve and remove the light-exposed portion, and rinsed with pure water for 30 seconds. As a result, the residual film ratio [(film thickness after development)/(film thickness before development)]×100 was very high at 93.1%.

The resulting material was then subjected to curing at 150° C. for 30 minutes and at 400 C. for 30 minutes in a clean oven under nitrogen atmosphere. The water absorption of the cured film was 0.3%. Then, the passivation film 3 was etched by reactive ion etching (RIE). Thereon was formed a Cr simple substance film by sputtering. (FIG. 2b)

Then, as shown in FIG. 2c, a wiring metal film was formed by plating. Then, as shown in FIG. 2d, the positive photosensitive resin composition was coated and a pattern (an insulating film) 7 was formed via photolithography. Then, as shown in FIG. 3b, a barrier metal 8 and a solder 10 were deposited in this order, by plating. Then, as shown in FIG. 4a, a flux 11 was coated and the solder 10 was melted by heating. Then, the flux 11 was removed by washing, to form a solder bump 12 as shown in FIG. 4b, and dicing was conducted along a scribing line to obtain individual chips.

EXAMPLE 2

Preparation and evaluation were made in the same manner as in Example 1 except that, in the polyamide synthesis of Example 1, the dicarboxylic acid derivative obtained by the reaction between 1 mole of diphenyl ether-4,4'-dicarboxylic acid and 2 moles of 1-hydroxy-1,2,3-benzotriazole was replaced by a dicarboxylic acid derivative obtained by a reaction between 1 mole of adipic acid and 2 moles of 1-hydroxy-1,2,3-benzotriazole, to synthesize a polyamide (A-2).

EXAMPLE 3

Preparation and evaluation were made in the same manner as in Example 1 except that, in the polyamide synthesis of Example 1, the hexafluoro-2,2-bis(3-amino-4-hydroxyphenyl)propane was replaced by 3,3'-diamino-4,4'-dihydroxydiphenylsulfone to synthesize a polyamide (A-3).

EXAMPLE 4

Preparation and evaluation were made in the same manner as in Example 1 except that, in the polyamide synthesis of Example 1, the 5-norbornene-2,3-dicarboxylic acid anhydride was replaced by maleic anhydride to synthesize a polyamide (A-4) and that the curing conditions were changed to 150° C.×30 minutes and 420° C.×30 minutes under nitrogen atmosphere.

EXAMPLE 5

Preparation and evaluation were made in the same manner as in Example 1 except that the photosensitive diazoquinone compound B-1 in the photosensitive resin composition was changed to the undermentioned compound B-2, the amount of this compound used was changed as shown in Table 1, and the curing conditions were changed to 150° C.×30 minutes and 380° C.×30 minutes under nitrogen atmosphere.

B-2:

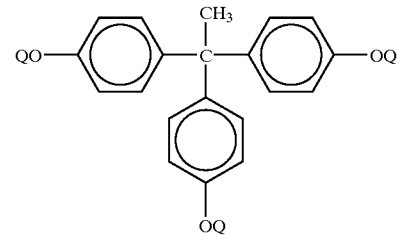

In the above formula, each Q is hydrogen atom or

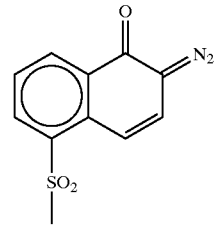

and 70% of the total Qs is

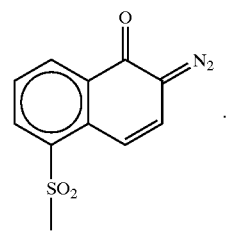

EXAMPLE 6

Preparation and evaluation were made in the same manner as in Example 1 except that the photosensitive diazoquinone compound B-1 in the photosensitive resin composition was changed to the undermentioned compound B-3, and the curing conditions were changed to 150° C.×30 minutes and 350° C.×30 minutes under nitrogen atmosphere.

B-3:

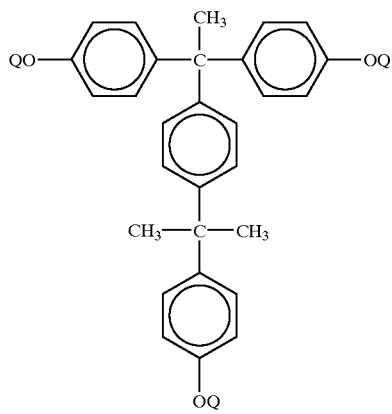

In the above formula, each Q is hydrogen atom or

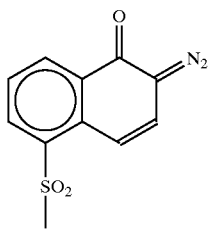

and 60% of the total Qs is

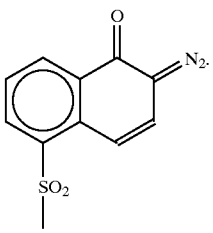

EXAMPLE 7

Preparation and evaluation were made in the same manner as in Example 1 except that the amount of the photosensitive diazoquinone compound B-1 in the photosensitive resin composition was changed as shown in Table 1.

EXAMPLE 8

Preparation and evaluation were made in the same manner as in Example 1 except that 10 g of the following bisphenol compound C-1 was added to the photosensitive resin composition of Example 1.

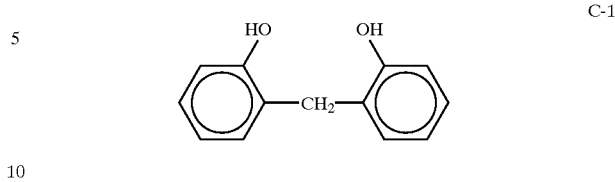

COMPARATIVE EXAMPLE 1

A flip chip similar to that of Example 1 was produced by using a photo-insensitive polyimide resin, CRC-6061 (a product of Sumitomo Bakelite Company Limited). Coating was made, by using a spin coater, on a wafer wherein a via hole had been formed in a passivation film using a resist. Then, drying was conducted on a hot plate at 140° C. for 4 minutes to form a coating film having a thickness of about 5 μm. Thereon was coated a positive resist, OFPR-800 (a product of Tokyo Ohka Kogyo Co., Ltd.) by using a spin coater, followed by drying on a hot plate at 100° C. for 2 minutes to obtain a coating film having a thickness of about 2 μm. To this coating film was applied a light at 400 mJ/cm$^2$ through a reticle by using a g-line stepper, NSR-1505G3A (a product of Nikon Corporation). Then, the resulting material was immersed in a 2.38% aqueous tetramethylammonium hydroxide solution for 60 seconds to dissolve and remove the light-exposed portion, and was rinsed with pure water for 30 seconds.

Then, the resulting material was subjected to curing in a clean oven under nitrogen atmosphere at 150° C. for 30 minutes and at 400° C. for 30 minutes. The water absorption of the cured film was 2.0%.

The photo-insensitive polyimide gives inferior precision of processing, making it impossible to use the buffer coat layer as a mask for reactive ion etching (RIE); therefore, it was necessary to form a via hole in a passivation film by using a resist. The cured film has a high water absorption of 2.0% and is inferior in reliability.

COMPARATIVE EXAMPLE 2

Preparation and evaluation were made in the same manner as in Example 1 except that the curing conditions were changed to 150° C.×30 minutes and 270° C.×30 minutes under nitrogen atmosphere. Cracks appeared in the buffer coat film after the formation of a bump.

The results of measurements in Examples and Comparative Examples are shown in Table 1.

TABLE 1

|  | Polyamide (A) (g) | Photosensitive diazoquinone (B) (g) | Phenol compound (C) (g) | Water absorption (%) | Curing temperature (° C.) |
| --- | --- | --- | --- | --- | --- |
| Example 1 | A-1 100 | B-1 25 | — | 0.3 | 400 |
| Example 2 | A-2 100 | B-1 25 | — | 0.2 | 400 |
| Example 3 | A-3 100 | B-1 25 | — | 0.6 | 400 |
| Example 4 | A-4 100 | B-1 25 | — | 0.3 | 420 |
| Example 5 | A-1 100 | B-2 35 | — | 0.3 | 380 |
| Example 6 | A-1 100 | B-3 25 | — | 0.3 | 350 |
| Example 7 | A-1 100 | B-1 20 | — | 0.3 | 400 |
| Example 8 | A-1 100 | B-1 25 | 10 | 0.3 | 400 |

TABLE 1-continued

|  | Polyamide (A) (g) | Photosensitive diazoquinone (B) (g) | Phenol compound (C) (g) | Water absorption (%) | Curing temperature (° C.) |
| --- | --- | --- | --- | --- | --- |
| Comparative Example 1 | — | — | — | 2 | 400 |
| Comparative Example 2 | A-1 100 | B-1 25 | — | 0.3 | 270 |

(Water absorption was measured according to JIS K 6911.)

As clear from the above Examples, in the present invention, a passivation layer is etched by using a photosensitive buffer coat resin (a polybenzoxazole resin precursor) as a mask; therefore, the present invention, as compared with conventional techniques, enables a significant reduction in operational steps. Further, the polybenzoxazole resin of the present invention is low in water absorption and superior in adhesivity to an encapsulating resin; therefore, can provide an inexpensive and highly reliable semiconductor device.

INDUSTRIAL APPLICABILITY

The semiconductor device having a positive photosensitive resin composition and provided with a bump electrode, according to the present invention can be used for electric or electronic products such as computers including personal computers, televisions, video decks and the like.

What is claimed is:

1. A semiconductor device comprising:
(a) a polybenzoxazole resin film for chip protection, obtained by coating, on a circuit-formed chip, a positive photosensitive resin composition comprising 100 parts by weight of a polyamide represented by the following general formula (1) and 1 to 100 parts by weight of a photosensitive diazoquinone compound, and subjecting the coated composition to patterning and curing, and
(b) a bump electrode:

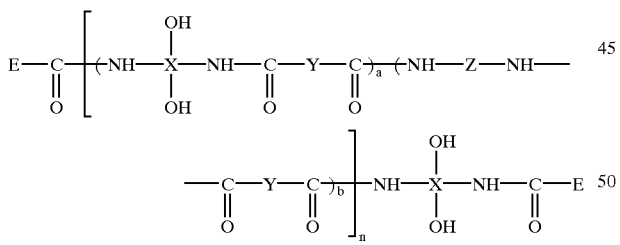

(1)

wherein X is a tetravalent aromatic group; Y is a bivalent aromatic group; Z is

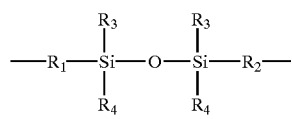

($R_1$ and $R_2$ are each a bivalent organic group, and $R_3$ and $R_4$ are each a monovalent organic group); E is a carboxyl aliphatic, alicyclic or aromatic group having at least one alkenyl or alkinyl group; and a and b are each a molar fraction, a+b=100 mole %, a=60.0 to 100.0 mole % and b=0 to 40.0 mole %; and n=2 to 500.

2. A semiconductor device according to claim 1, wherein the positive photosensitive resin composition contains a bisphenol compound represented by the following general formula (2) and a trisphenol compound represented by the following general formula (3) in a total amount of 1 to 30 parts by weight:

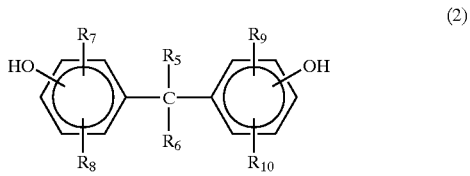

(2)

wherein $R_5$ and $R_6$ are each hydrogen atom or an alkyl group; $R_7$, $R_8$, $R_9$ and $R_{10}$ are each one atom or group selected from hydrogen atom, a halogen atom, hydroxyl group, an alkoxy group, a cycloalkyl group and an alkyl group, and

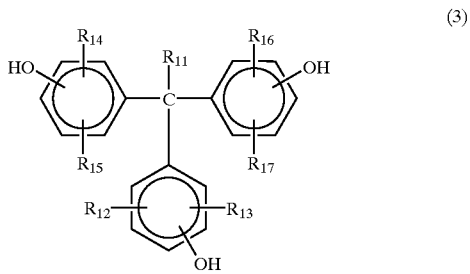

(3)

wherein $R_{11}$ is hydrogen atom or an alkyl group; and $R_{12}$, $R_{13}$, $R_{14}$, $R_{15}$, $R_{16}$ and $R_{17}$ are each one atom or group selected from hydrogen atom, a halogen atom, hydroxyl group, an alkyl group, an alkoxy group and a cycloalkyl group.

3. A semiconductor device according to claim 2, wherein the proportions of the bisphenol compound and the trisphenol compound are 10:90 to 90:10.

4. A semiconductor device according to claim 1, wherein the X of the polyamide is selected from the followings:

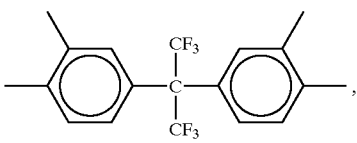

-continued

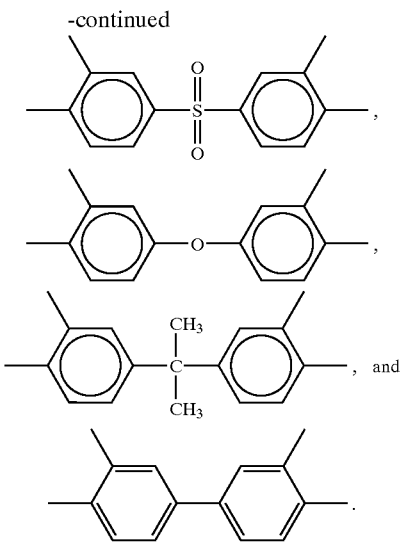

5. A semiconductor device according to claim 1, wherein the Y of the polyamide is selected from the followings:

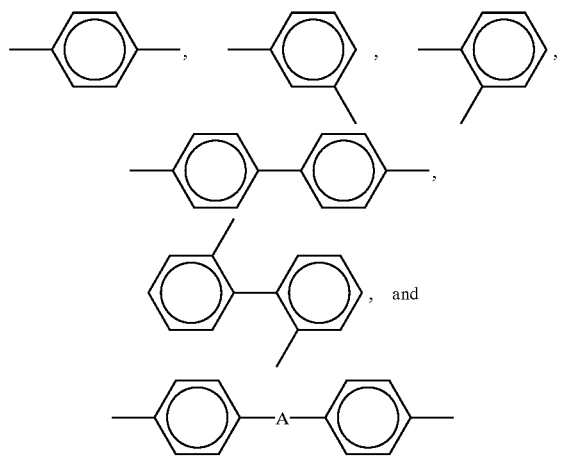

wherein A is —CH$_2$—, —C(CH$_3$)$_2$—, —O—, —S—, —SO$_2$—, —CO—, —NHCO— or —C(CF$_3$)$_2$—.

6. A semiconductor device according to claim 1, wherein the positive photosensitive resin composition is cured at a temperature of 280 to 440° C.

7. A semiconductor device according to claim 2, wherein the X of the polyamide is selected from the followings:

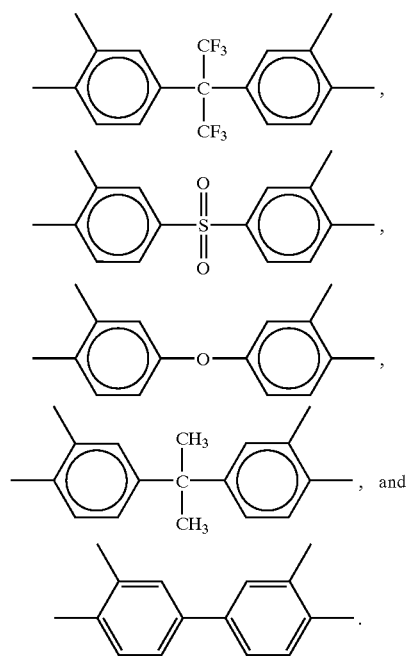

8. A semiconductor device according to claim 2, wherein the Y of the polyamide is selected from the followings:

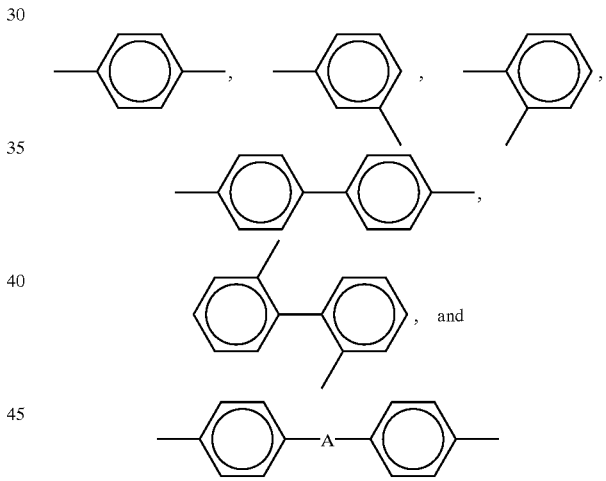

wherein A is —CH$_2$—, —C(CH$_3$)$_2$—, —O—, —S—, —SO$_2$—, —CO—, —NHCO— or —C(CF$_3$)$_2$—.

* * * * *